United States Patent
Zhou et al.

(10) Patent No.: US 12,278,305 B2
(45) Date of Patent: Apr. 15, 2025

(54) GLASS PANEL AND SILICON WAFER SEPARATION DEVICE FOR PHOTOVOLTAIC MODULE RECOVERY

(71) Applicant: CHANGZHOU INSTITUTE OF TECHNOLOGY, Changzhou (CN)

(72) Inventors: Pin Zhou, Changzhou (CN); Jingbo Zhao, Changzhou (CN); Xiaohui Chen, Changzhou (CN); Quanfa Zhou, Changzhou (CN); Shubo Wang, Changzhou (CN); Yu Zhao, Changzhou (CN)

(73) Assignee: CHANGZHOU INSTITUTE OF TECHNOLOGY, Changzhou (CN)

( * ) Notice: Subject to any disclaimer, the term of this patent is extended or adjusted under 35 U.S.C. 154(b) by 277 days.

(21) Appl. No.: 18/103,511

(22) Filed: Jan. 31, 2023

(65) Prior Publication Data
US 2024/0120429 A1  Apr. 11, 2024

(30) Foreign Application Priority Data

Oct. 11, 2022 (CN) .......................... 202211239205.6

(51) Int. Cl.
*H01L 31/18* (2006.01)
*B09B 5/00* (2006.01)

(52) U.S. Cl.
CPC ................ *H01L 31/18* (2013.01); *B09B 5/00* (2013.01)

(58) Field of Classification Search
CPC ........... H01L 31/18; B09B 5/00; Y02W 30/20
See application file for complete search history.

(56) References Cited

U.S. PATENT DOCUMENTS

| 2021/0276815 A1* | 9/2021 | Kawadahara ......... H01L 21/187 |
| 2022/0140175 A1* | 5/2022 | Matsumoto ............. H01L 31/18 29/762 |

* cited by examiner

*Primary Examiner* — Daniel McNally
(74) *Attorney, Agent, or Firm* — Bayramoglu Law Offices LLC

(57) ABSTRACT

A glass panel and silicon wafer separation device for photovoltaic module recovery includes a tank body, a supporting plate and at least two floating blocks. The supporting plate is positioned in the tank body. A vertically arranged first cylinder is arranged at a lower end of the tank body. An output end of the first cylinder is fixedly connected to a lower end of the supporting plate. A groove is formed in an upper end of the supporting plate, and the groove is matched with a photovoltaic plate. A heating block is mounted at a lower end of an inner wall of the tank body. The at least two floating blocks are columnar. Lower ends of the at least two floating blocks are fixedly connected to chucks, and the chucks are downwards opened. Fixed pipes are connected between the at least two floating blocks.

10 Claims, 5 Drawing Sheets

GLASS PANEL AND SILICON WAFER SEPARATION DEVICE FOR PHOTOVOLTAIC MODULE RECOVERY

CROSS REFERENCE TO THE RELATED APPLICATIONS

This application is based upon and claims priority to Chinese Patent Application No. 202211239205.6, filed on Oct. 11, 2022, the entire contents of which are incorporated herein by reference.

TECHNICAL FIELD

The present disclosure relates to the technical field of photovoltaic module recovery, and particularly relates to a glass panel and silicon wafer separation device for photovoltaic module recovery.

BACKGROUND

With the problems of energy shortage, environmental pollution, climate change and the like are becoming increasingly prominent, the energy revolution of replacing traditional energy with clean energy is quietly staged, and solar energy is one of the most potential clean energy sources. In solar power generation technologies, photovoltaic power generation has always dominated the industry. With practical operation of large-scale centralized and distributed photovoltaic power generation projects, the disposal of waste photovoltaic modules will be increasingly prominent. Improper disposal of the waste photovoltaic modules not only leads to environmental pollution, but also causes waste of resources.

The recovery of waste crystalline silicon photovoltaic modules in the world generally includes the following disposal links: 1) disassembly and transportation: the waste crystalline silicon photovoltaic modules are disassembled and transported to a recovery mechanism; 2) disassembly: aluminum frames and junction boxes of the crystalline silicon photovoltaic modules are disassembled; 3) separation: the disassembled crystalline silicon photovoltaic modules are laminated pieces composed of front glass, solar cells, back plates (or back glass) and EVA, and these parts of the laminated pieces are separated to sort out valuable materials; and 4) reutilization: the sorted different materials are delivered to corresponding industries for reutilization.

In the process of separating the laminated piece, according to different separation modes for laminated pieces, the current recovery modes of the waste crystalline silicon photovoltaic modules include 3 manners of a heat treatment method, a chemical dissolution method and a physical separation method. The photovoltaic modules are generally decomposed and recovered through the heat treatment method and the chemical treatment method. The heat treatment method is generally carried out through high-temperature incineration or a fluidized bed reactor for heat treatment to realize the separation of glass and a packaging material, but the energy consumption is relatively high, and generated gas also causes secondary pollution to the environment. The chemical dissolution method is generally carried out through inorganic or organic acid for dissolution to realize the separation of the glass and the packaging material, the dissolution period is relatively long, and it is also difficult to perform after-treatment on a large amount of solvent. The physical separation method is generally carried out by crushing the modules and then separating the mixed materials. However, this method is difficult to achieve complete separation of a single component, and it takes much time, completely damages the glass and has low recovery efficiency.

After an EVA glue layer between the silicon wafer and the glass panel expands, the glue layer can be cut through a blade or a steel wire rope. Although the blade or the steel wire rope is very thick (directly), the expansion amplitude of the glue layer is limited, so after the glue layer expands, the distance between the silicon wafer and the glass panel is still very small. In the operation process, the blade or the steel wire rope may easily wipe the silicon wafer or the glass panel to cause damage to the silicon wafer or the glass panel, thus influencing the recovery value of the silicon wafer or the glass panel. Therefore, a glass panel and silicon wafer separation device for photovoltaic module recovery is provided.

SUMMARY

An objective of the present disclosure is to provide a glass panel and silicon wafer separation device for photovoltaic module recovery to solve the shortages in the prior art.

In order to achieve the above objective, the present disclosure adopts the following technical solution:

A glass panel and silicon wafer separation device for photovoltaic module recovery, which includes a tank body, a supporting plate and floating blocks; the supporting plate is positioned in the tank body; a vertically arranged first cylinder is arranged at a lower end of the tank body; an output end of the first cylinder is fixedly connected to a lower end of the supporting plate; a groove is formed in an upper end of the supporting plate, and the groove is matched with a photovoltaic plate; a heating block is mounted at a lower end of an inner wall of the tank body; at least two floating blocks are provided, and the floating blocks are columnar; lower ends of the floating blocks are fixedly connected to chucks, and the chucks are downwards opened; fixed pipes are connected between the floating blocks, and the fixed pipes communicate with exhaust ports of the chucks; the fixed pipes further communicate with one end of a hose, and the other end of the hose extends to an outer side of the tank body; a horizontally arranged third cylinder is fixedly mounted on a side wall of the tank body; an output end of the third cylinder extends into the tank body, and a horizontally arranged blade is mounted at the output end of the third cylinder; and when the first cylinder is in a shrinkage state, the blade is positioned above the supporting plate.

Preferably, the device further includes a cover plate; the cover plate is matched with the tank body; vertically arranged sleeves are arranged at a lower end of the cover plate; inner walls of the sleeves are matched with side walls of the floating blocks; and when the first cylinder is in the shrinkage state and the chucks are directly placed on the supporting plate, the uppermost ends of the floating blocks are inside the sleeves, and thus the floating blocks can be ensured not to disengage from the sleeves after the first cylinder is lowered.

Preferably, iron blocks are embedded in upper ends of the floating blocks; and electromagnets matched with the iron blocks are fixedly mounted at a top end of an inner wall of the cover plate.

Preferably, the device further includes a vertically arranged second cylinder; an output end of the second cylinder is fixedly connected to an upper end of the cover plate; the second cylinder is used for pulling the cover plate to move in a vertical direction; after a glue layer is cut, the floating blocks continuously float up; the iron blocks are attracted through the electromagnets; and a silicon wafer is lifted through the second cylinder, thus the silicon wafer can be conveniently taken out, and the working efficiency can be efficiently improved.

Preferably, inner side walls of two opposite sides of the groove are inclined; a rubber strip is inserted between the groove and the photovoltaic plate; a handle is mounted at an upper end of the rubber strip; and the rubber strip is inserted between the groove and the photovoltaic plate, thus the photovoltaic plate cannot fall off from the groove when the photovoltaic plate is pulled by the floating blocks.

Preferably, an outer wall of the tank body is coated with an insulation plate.

Preferably, a sight glass is further mounted on the side wall of the tank body, and the sight glass penetrates through the insulation plate; a state of the glue layer can be observed through the sight glass, i.e., a distance between a glass panel and the silicon wafer can be observed; and in a case that the distance between the glass panel and the silicon wafer is sufficient, the glue layer can be cut off through the blade.

Preferably, the device further includes a shell; a lower end of the first cylinder is fixedly connected to a bottom end of an inner wall of the shell; a stretching end of the first cylinder extends into the tank body and is fixedly connected to the lower end of the supporting plate; and the shell is used for supporting the tank body.

Preferably, a supporting frame for supporting the third cylinder is fixedly mounted on a side wall of the shell.

Preferably, a depth of the groove is smaller than a thickness of the glass panel in the photovoltaic plate; and an upper end of the glass panel is positioned above the supporting plate to ensure that the lowermost end of the glue layer is positioned above the supporting plate.

The present disclosure has the following beneficial effects:
1. In the use process of the separation device provided by the present disclosure, water in the tank body is heated to 90° C. or above; then the first cylinder is started to jack the supporting plate to reach a position above the water surface; then the photovoltaic plate is put into the groove, a glass surface of the photovoltaic plate is close to the groove, the rubber strip is inserted between the groove and the photovoltaic plate, and the chucks are adsorbed onto the upper end of the photovoltaic plate; the cover plate is covered; the first cylinder is controlled to lower until the photovoltaic plate is just immersed into the water; the glue layer is soaked in hot water to be softened, the supporting plate is continuously lowered, the buoyancy force borne by the floating blocks is gradually increased, then the supporting plate is pulled upwards by the floating blocks, the glue layer is slowly lengthened, thus a gap between the silicon wafer and the glass panel is enlarged, and at the moment, the third cylinder can be used for conveniently driving the blade to cut off glue.
2. In the use process of the device, the sleeves are capable of limiting the positions of the floating blocks, so that the floating blocks can only move in the vertical direction; when the blade is used for cutting the glue layer, the silicon wafer cannot shake; after the glue is cut off, the floating blocks float upwards until the top ends of the floating blocks are in contact with the electromagnets, and the electromagnets are turned on at the same time to attract the iron blocks by the electromagnets, and the floating blocks can be adsorbed; then the cover plate is lifted through the second cylinder, thus the silicon wafer can be taken out; and after the supporting plate is lifted through the first cylinder, the glass panel can be taken out, and therefore, the separation of the glass panel and the silicon wafer is realized.

In the figures: 1, tank body; 2, shell; 3, first cylinder; 4, supporting plate; 5, floating block; 6, chuck; 7, fixed pipe; 8, hose; 9, cover plate; 10, second cylinder; 11, iron block; 12, electromagnet; 13, third cylinder; 14, blade; 15, supporting frame; 16, heating block; 17, groove; 18, rubber strip; 19, handle; 20, sleeve; 21, insulation plate; 22, sight glass; and 23, photovoltaic plate.

DETAILED DESCRIPTION OF THE EMBODIMENTS

The technical solutions in the embodiments of the present disclosure will be clearly and completely described in conjunction with the accompanying drawings in the embodiments of the present disclosure, and obviously, the described embodiments are only a part of the embodiments of the present disclosure, but not all the embodiments.

Figure 1:
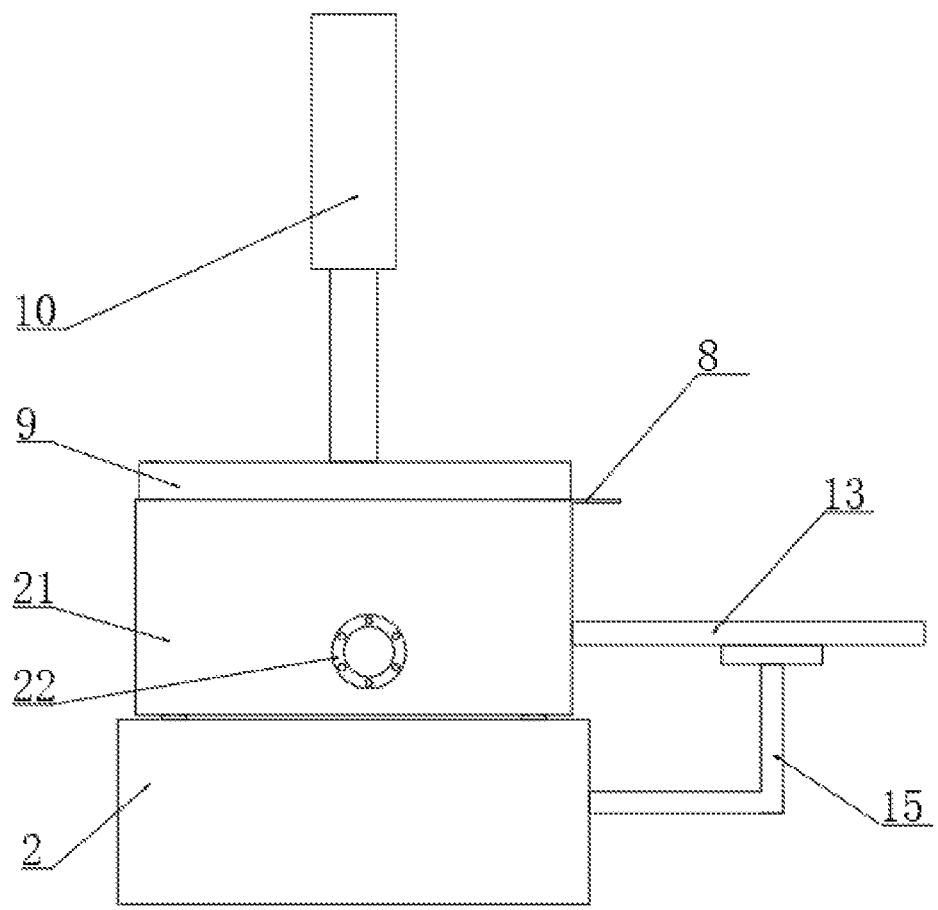
FIG. 1 is a schematic main view structure diagram of a glass panel and silicon wafer separation device for photovoltaic module recovery provided by the present disclosure.
Figure 2:
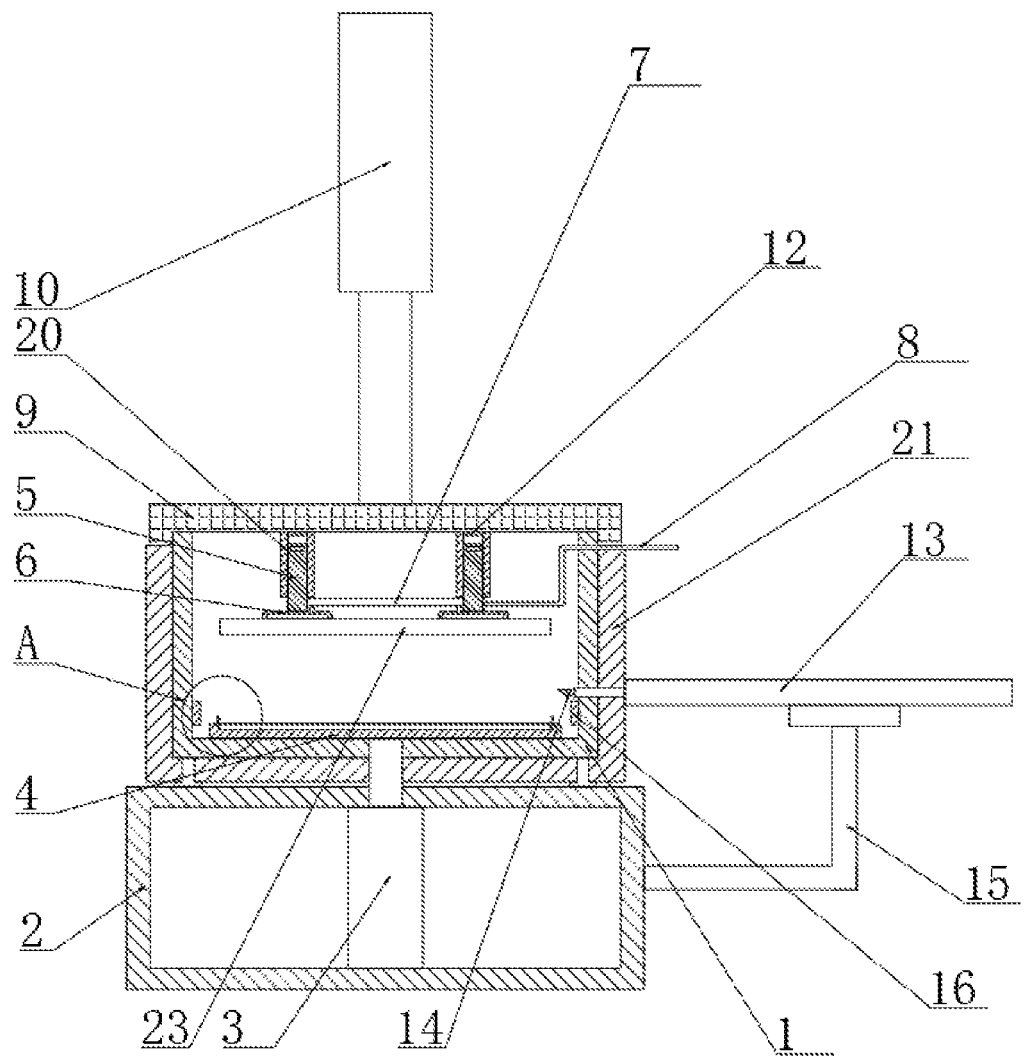
FIG. 2 is a schematic main section structure diagram of a glass panel and silicon wafer separation device for photovoltaic module recovery provided by the present disclosure.
Figure 3:
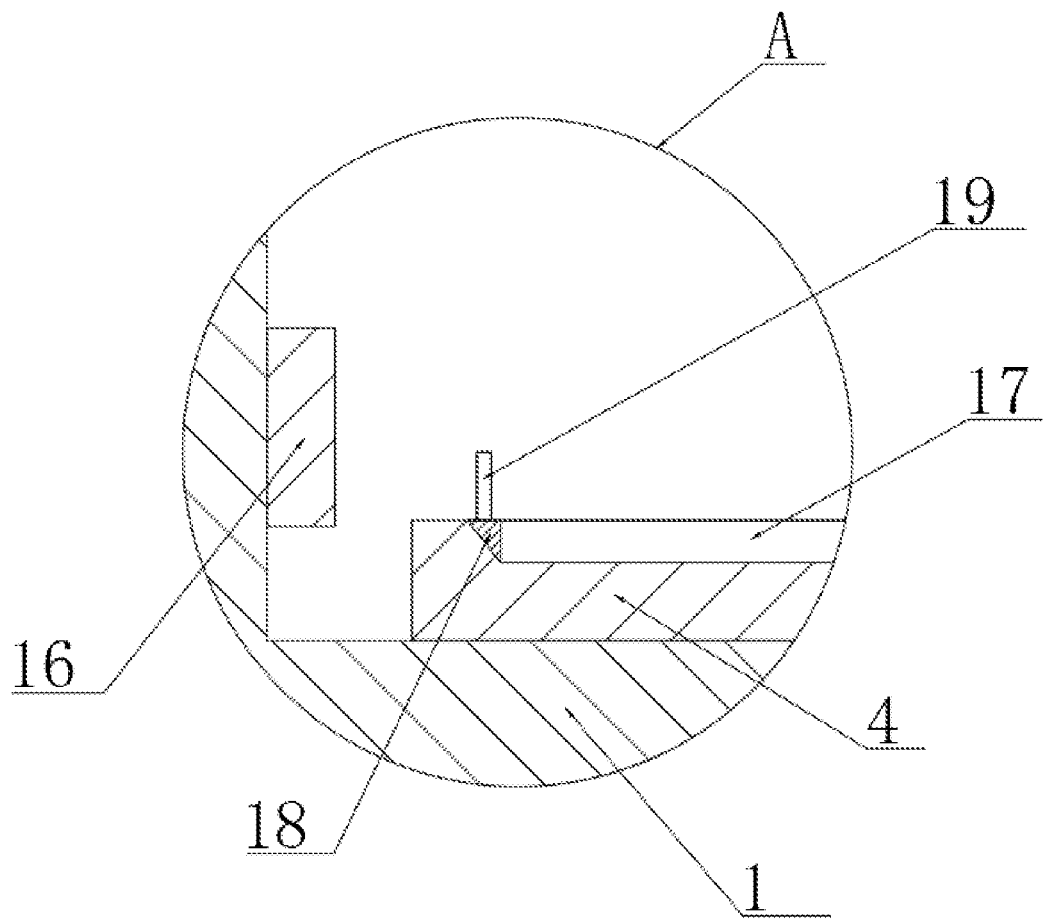
FIG. 3 is a schematic enlarged structure diagram of a part A in FIG. 1 of a glass panel and silicon wafer separation device for photovoltaic module recovery provided by the present disclosure.
Figure 4:
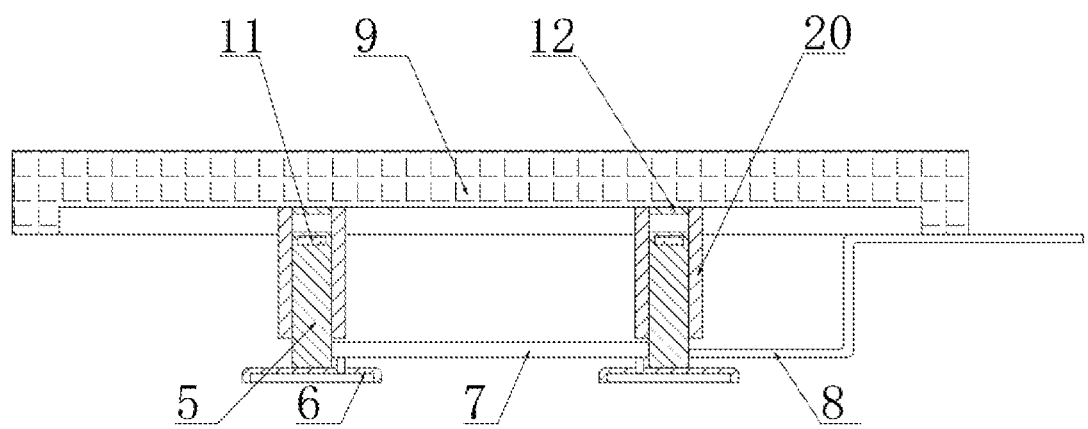
FIG. 4 is a schematic section view structure diagram of a cover plate and floating blocks of a glass panel and silicon wafer separation device for photovoltaic module recovery provided by the present disclosure.
Figure 5:
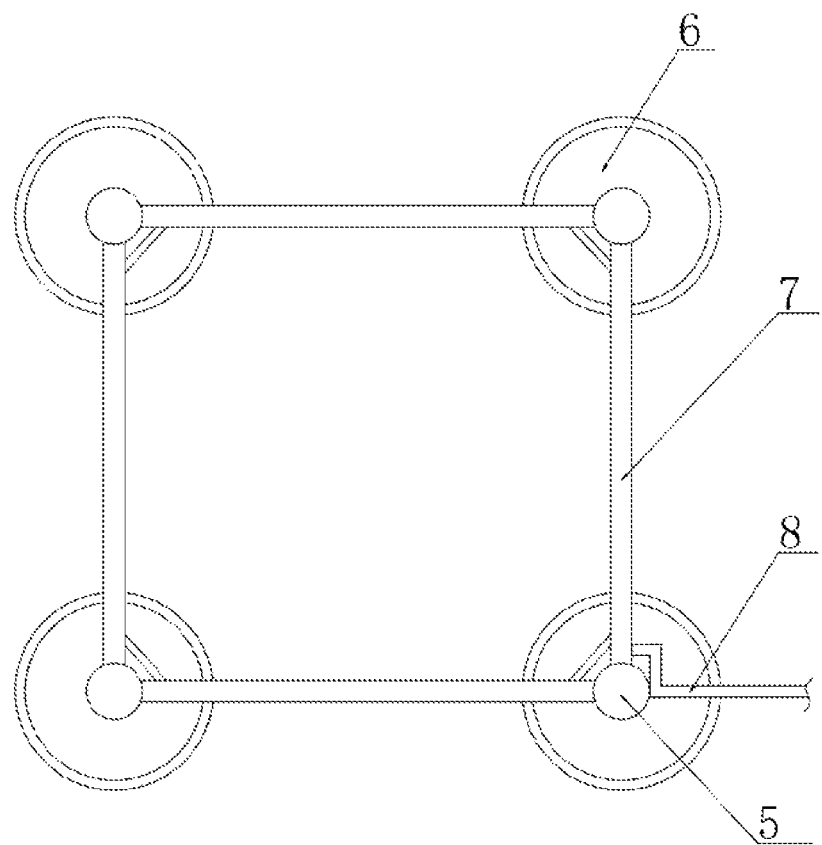
FIG. 5 is a schematic overlook structure diagram of floating blocks and chucks of a glass panel and silicon wafer separation device for photovoltaic module recovery provided by the present disclosure.
Figure 6:
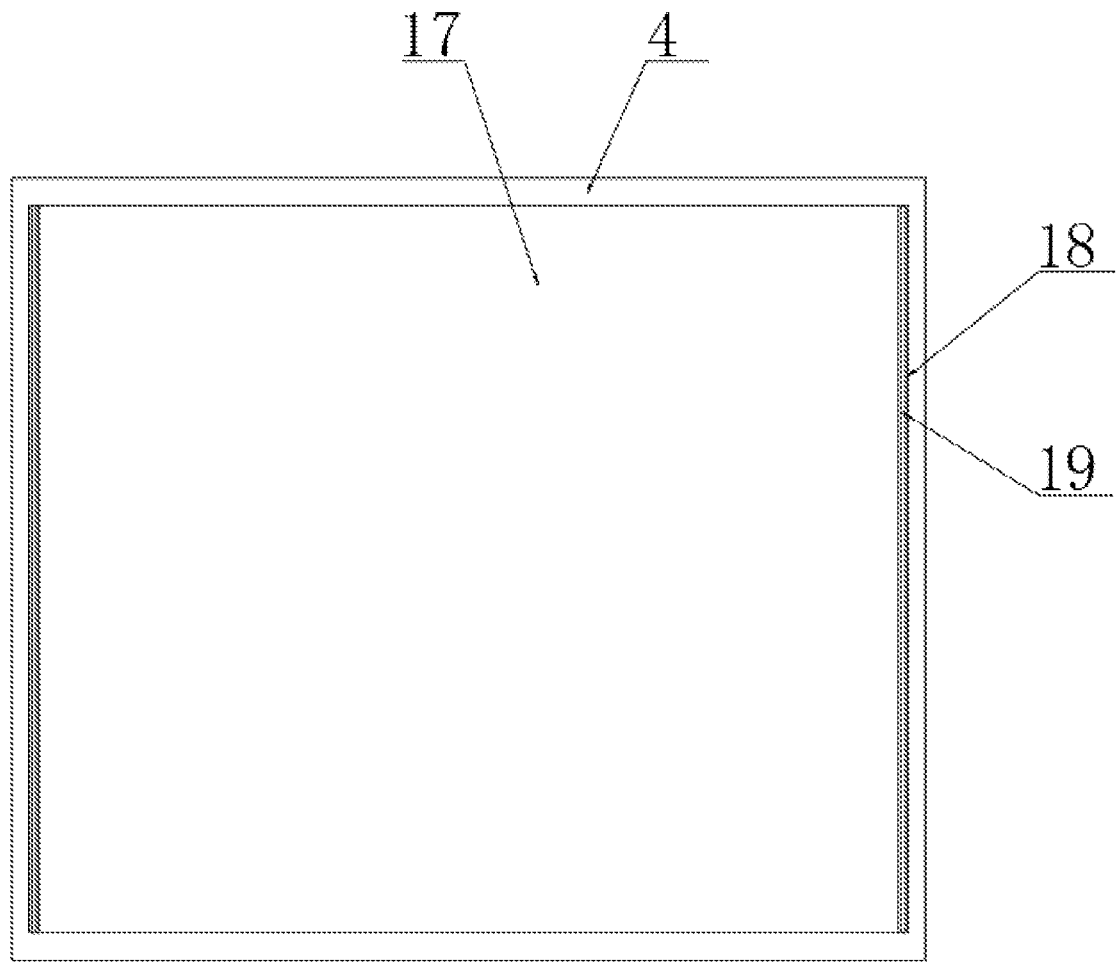
FIG. 6 is a schematic overlook structure diagram of a supporting plate of a glass panel and silicon wafer separation device for photovoltaic module recovery provided by the present disclosure.

Referring to FIG. 1 to FIG. 6, a glass panel and silicon wafer separation device for photovoltaic module recovery includes a tank body 1, a supporting plate 4 and floating blocks 5; the supporting plate 4 is positioned in the tank body 1; a vertically arranged first cylinder 3 is arranged at a lower end of the tank body 1; an output end of the first cylinder 3 is fixedly connected to a lower end of the supporting plate 4; a groove 17 is formed in an upper end of the supporting plate 4, and the groove 17 is matched with a photovoltaic plate 23; a heating block 16 is mounted at a lower end of an inner wall of the tank body 1; at least two floating blocks 5 are provided, and the floating blocks 5 are columnar; lower ends of the floating blocks 5 are fixedly connected to chucks 6, and the chucks 6 are downwards opened; fixed pipes 7 are connected between the floating blocks 5, and the fixed pipes 7 communicate with exhaust ports of the chucks 6; the fixed pipes 7 further communicate with one end of a hose 8, and the other end of the hose 8 extends to an outer side of the tank body 1; a horizontally arranged third cylinder 13 is fixedly mounted on a side wall of the tank body 1; an output end of the third cylinder 13 extends into the tank body 1, and a horizontally arranged blade 14 is mounted at the output end of the third cylinder 13; when the first cylinder 3 is in a shrinkage state, the blade 14 is positioned above the supporting plate 4; a length of the blade 14 is greater than that of the photovoltaic plate 23; and an outer wall of the tank body 1 is coated with an insulation plate 21.

The device further includes a cover plate 9; the cover plate 9 is matched with the tank body 1; vertically arranged sleeves 20 are arranged at a lower end of the cover plate 9; inner walls of the sleeves 20 are matched with side walls of the floating blocks 5; and when the first cylinder 3 is in the shrinkage state and the chucks are directly placed on the supporting plate 4, the uppermost ends of the floating blocks 5 are inside the sleeves 20, and thus the floating blocks 5 can be ensured not to disengage from the sleeves 20 after the first cylinder 3 is lowered.

Iron blocks 11 are embedded in upper ends of the floating blocks 5; and electromagnets 12 matched with the iron blocks 11 are fixedly mounted at a top end of an inner wall of the cover plate 9. The device further includes a vertically arranged second cylinder 10, and the second cylinder 10 can be fixedly mounted through supporting parts such as a support; an output end of the second cylinder 10 is fixedly connected to an upper end of the cover plate 9; the second cylinder 10 is used for pulling the cover plate 9 to move in a vertical direction; after a glue layer is cut, the floating blocks 5 continuously float up; the iron blocks 11 are attracted through the electromagnets; and a silicon wafer is lifted through the second cylinder 10, thus the silicon wafer can be conveniently taken out, and the working efficiency can be efficiently improved.

Inner side walls of two opposite sides of the groove 17 are inclined; a rubber strip 18 is inserted between the groove 17 and the photovoltaic plate 23; a handle 19 is mounted at an upper end of the rubber strip 18; and the rubber strip 18 is inserted between the groove 17 and the photovoltaic plate 23, thus the photovoltaic plate 23 cannot fall off from the groove 17 when the photovoltaic plate 23 is pulled by the floating blocks.

A sight glass 22 is further mounted on the side wall of the tank body 1, and the sight glass 22 penetrates through the insulation plate 21; a state of the glue layer can be observed through the sight glass 22, i.e., a distance between a glass panel and the silicon wafer can be observed; and in a case that the distance between the glass panel and the silicon wafer is sufficient, the glue layer can be cut off through the blade 14.

The device further includes a shell 2; a lower end of the first cylinder 3 is fixedly connected to a bottom end of an inner wall of the shell 2; a stretching end of the first cylinder 3 extends into the tank body 1 and is fixedly connected to the lower end of the supporting plate 4; the shell 2 is used for supporting the tank body 1; and a supporting frame 15 for supporting the third cylinder 13 is fixedly mounted on a side wall of the shell 2.

A depth of the groove 17 is smaller than a thickness of the glass panel in the photovoltaic plate 23; and an upper end of the glass panel is positioned above the supporting plate 4 to ensure that the lowermost end of the glue layer is positioned above the supporting plate 4.

In the use process of the separation device provided by the present disclosure, water in the tank body 1 is heated to 90° C. or above; then the first cylinder 3 is started to jack the supporting plate 4 to reach a position above the water surface; then the photovoltaic plate 23 is put into the groove 17, a glass surface of the photovoltaic plate 23 is close to the groove 17, the rubber strip 18 is inserted between the groove 17 and the photovoltaic plate 23, and the chucks 6 are adsorbed onto the upper end of the photovoltaic plate 23; the cover plate 9 is covered; the first cylinder 3 is controlled to lower until the photovoltaic plate 23 is just immersed into the water; the glue layer is soaked in hot water to be softened, the supporting plate 4 is continuously lowered, the buoyancy force borne by the floating blocks 5 is gradually increased, then the supporting plate 4 is pulled upwards by the floating blocks 5, the glue layer is slowly lengthened, thus a gap between the silicon wafer and the glass panel is enlarged, and at the moment, the third cylinder 13 can be used for conveniently driving the blade 14 to cut off glue.

In the use process of the device, the sleeves 20 are capable of limiting the positions of the floating blocks 5, so that the floating blocks 5 can only move in the vertical direction; when the blade 14 is used for cutting the glue layer, the silicon wafer cannot shake; after the glue layer is cut off, the floating blocks 5 float upwards until the top ends of the floating blocks 5 are in contact with the electromagnets 12, and the electromagnets 12 are turned on at the same time to attract the iron blocks 11 by the electromagnets 12, and the floating blocks 5 can be adsorbed; then the cover plate 9 is lifted through the second cylinder 10, thus the silicon wafer can be taken out; and after the supporting plate 4 is lifted through the first cylinder 3, the glass panel can be taken out, and therefore, the separation of the glass panel and the silicon wafer is realized.

In the device, the glue layer is softened by the hot water; the photovoltaic plate 23 is in full contact with the hot water after the photovoltaic plate 23 is immersed into the hot water, the hot water is good in heat transfer effect and can be recycled, so the energy sources can be effectively saved, and the glue layer is convenient to soften; and moreover, the photovoltaic plate 23 is pulled by the buoyancy force, the buoyancy force borne by the photovoltaic plate 23 is increased with the increasing of the immersion depth of the floating blocks 5; and the stress of the photovoltaic plate 23 is slowly changed from small to large, so that the photovoltaic plate 23 is prevented from being damaged due to sudden excessive stress borne by the photovoltaic plate 23, and the integrity of the silicon wafer is ensured.

In the actual use process of the device, the time from mounting of the photovoltaic plate 23 to deformation of the glue layer to a proper range, namely the distance between the glass panel and the silicon wafer is obviously greater than the thickness of the blade, is generally 20-40 min; at the moment, the glue layer can be conveniently cut off; and the soaking time can be slightly changed according to the thickness of the glue layer and the proportion of glue layer raw materials.

The above description is only the better specific embodiments of the present disclosure, but the protection scope of the present disclosure is not limited to this, and the equivalent replacement or changes made by any person skilled in the art of the present disclosure within the scope of the technology disclosed in the present disclosure according to the technical solution and the inventive concept of the present disclosure should be covered by the protection scope of the present disclosure.

What is claimed is:

1. A glass panel and silicon wafer separation device for photovoltaic module recovery, comprising a tank body, a supporting plate and at least two floating blocks, wherein the supporting plate is positioned in the tank body; a vertically arranged first cylinder is arranged at a lower end of the tank body; an output end of the vertically arranged first cylinder is fixedly connected to a lower end of the supporting plate; a groove is formed in an upper end of the supporting plate, and the groove is matched with a photovoltaic plate; a heating block is mounted at a lower end of an inner wall of the tank body; the at least two floating blocks are columnar; lower ends of the at least two floating blocks are fixedly connected to chucks, and the chucks are downwards opened; fixed pipes are connected between the at least two floating blocks, and the fixed pipes communicate with exhaust ports of the chucks; the fixed pipes further communicate with a first end of a hose, and a second end of the hose extends to an outer side of the tank body; a horizontally arranged third cylinder is fixedly mounted on a side wall of the tank body; an output end of the horizontally arranged third cylinder extends into the tank body, and a horizontally arranged blade is mounted at the output end of the horizontally arranged third cylinder; and when the vertically arranged first cylinder is in a shrinkage state, the horizontally arranged blade is positioned above the supporting plate.

2. The glass panel and silicon wafer separation device according to claim 1, further comprising a cover plate; wherein the cover plate is matched with the tank body; vertically arranged sleeves are arranged at a lower end of the cover plate; and inner walls of the vertically arranged sleeves are matched with side walls of the at least two floating blocks.

3. The glass panel and silicon wafer separation device according to claim 2, wherein iron blocks are embedded in upper ends of the at least two floating blocks; and electromagnets matched with the iron blocks are fixedly mounted at a top end of an inner wall of the cover plate.

4. The glass panel and silicon wafer separation device according to claim 3, further comprising a vertically arranged second cylinder; wherein an output end of the vertically arranged second cylinder is fixedly connected to an upper end of the cover plate; and the vertically arranged second cylinder is configured to pull the cover plate to move in a vertical direction.

5. The glass panel and silicon wafer separation device according to claim 1, wherein an outer wall of the tank body is coated with an insulation plate.

6. The glass panel and silicon wafer separation device according to claim 5, wherein a sight glass is mounted on the side wall of the tank body, and the sight glass penetrates through the insulation plate.

7. The glass panel and silicon wafer separation device according to claim 1, further comprising a shell; wherein a lower end of the vertically arranged first cylinder is fixedly connected to a bottom end of an inner wall of the shell; a stretching end of the vertically arranged first cylinder extends into the tank body and is fixedly connected to the lower end of the supporting plate; and the shell is configured to support the tank body.

8. The glass panel and silicon wafer separation device according to claim 7, wherein a supporting frame for supporting the horizontally arranged third cylinder is fixedly mounted on a side wall of the shell.

9. The glass panel and silicon wafer separation device according to claim 1, wherein inner side walls of two opposite sides of the groove are inclined; a rubber strip is inserted between the groove and the photovoltaic plate; and a handle is mounted at an upper end of the rubber strip.

10. The glass panel and silicon wafer separation device according to claim 1, wherein a depth of the groove is smaller than a thickness of a glass panel in the photovoltaic plate.

* * * * *